United States Patent [19]

Berkowitz et al.

[11] 4,370,661
[45] Jan. 25, 1983

[54] EASILY ASSEMBLED TRANSVERSE MAGNETIC PRINTING HEAD

[75] Inventors: Ami E. Berkowitz, Schenectady, N.Y.; Joseph A. Lahut, Waynesboro, Va.; Jish M. Wang, Schenectady, N.Y.

[73] Assignee: General Electric Company, Schenectady, N.Y.

[21] Appl. No.: 193,398

[22] Filed: Oct. 2, 1980

Related U.S. Application Data

[63] Continuation of Ser. No. 60,921, Jul. 26, 1979, abandoned.

[51] Int. Cl.³ .................................................. G11B 9/00
[52] U.S. Cl. ................................... 346/74.5; 346/139 C
[58] Field of Search ................... 346/74.5, 74.2, 153.1, 346/155, 139 C; 360/125, 126, 127, 123

[56] References Cited

U.S. PATENT DOCUMENTS

3,986,190 10/1976 Schwabe ............................ 346/74.5
4,025,927 5/1977 Nelson ................................ 360/123
4,060,811 11/1977 Faucz ................................... 360/57
4,097,871 6/1978 Berkowitz et al. ................. 360/124

Primary Examiner—Alan Faber
Attorney, Agent, or Firm—Marvin Snyder; James C. Davis, Jr.

[57] ABSTRACT

An easily assembled transverse magnetic printing head and method for making same are disclosed for use in a coincident current, matrix-driven, transverse printing head. In accordance with one embodiment of the present invention, digit lines pass through a recording gap in mirror image fashion as between adjacent word groupings. Similarly, the word line patterns are arranged on a printed circuit board in a zig-zag fashion. A feature common to both the word and digit line printed circuits, however, is the presence of a small expanse of circuit wiring unsupported by printed circuit substrate material through which a high permeability magnetic comb structure is inserted to form required recording gaps. The coincident current scheme is retained by driving the digit lines from alternating directions. The arrangement of the digit lines in the present invention permits the use of a planar printed circuit with no crossovers and therefore a circuit which is easily fabricated in a flexible, printed circuit design.

7 Claims, 11 Drawing Figures

EASILY ASSEMBLED TRANSVERSE MAGNETIC PRINTING HEAD

This is a continuation of application Ser. No. 060,921 filed July 26, 1979, now abandoned.

BACKGROUND OF THE INVENTION

This invention relates to transverse magnetic printing heads and methods for economically manufacturing such structures. More particularly, this invention relates to a novel printed circuit and magnetic comb structure for the digit and word drive lines in a coincident current, transverse magnetic printing head. A significant advantage gained by the structure produced herein is that the circuit provided at the matrix printing head is planar and, therefore, can be readily fabricated upon a flexible printed circuit substrate with high print resolution.

A detailed description of magnetic printing may be found in U.S. Pat. No. 4,097,871, issued to Berkowitz et al., the same inventors as herein, and which is assigned to the same assignee as this application. It is to be particularly noted, however that, in a transverse magnetic printing head, the direction of orientation of the magnetic field impressed on the recording medium is perpendicular to the direction of movement of the medium.

Magnetic printing basically involves the transfer of a dry magnetic ink image from a ferromagnetic recording medium to a permanent paper medium. To produce the magnetic image on the recording medium which attracts the magnetic ink from a reservoir to the magnetic recording medium in a transverse magnetic printing system, a long comb-like structure is provided which is oriented in a direction perpendicular to the direction of travel of the magnetic recording medium. The comb itself is composed of a material of high magnetic permeability, thereby facilitating the concentration of lines of magnetic flux at the tips of the teeth of the comb. Typically, a plurality of current carrying conductors is threaded through each of the gaps in the comb structure formed by its teeth and the current in these conductors controls the level of magnetic flux at the tips of the teeth of the comb. These regions of increased magnetic flux being in a position near to the magnetic recording medium permit the selected magnetization of regions in the medium which regions thereby attract the magnetic ink. In this manner, the currents in the conductors threaded through the teeth of the comb control the patterning of the magnetic ink on the ferromagnetic recording medium. The ink pattern is later transferred to a paper medium to which the pattern is permanently fixed and the pattern on the magnetic recording medium is subsequently magnetically erased prior to the recording of new information thereon and prior to the subsequent contact of that region of the medium with the paper.

To achieve high resolution, the teeth of the comb must be spaced relatively close together. For example, in recent magnetic printing head structures, the teeth of the comb are spaced to form approximately 120 gaps per inch providing for only a 4 mil spacing between adjacent teeth. Additionally, experiments indicate that 8 to 10 ampere-turns through the conductors is required to provide a magnetic image strong enough to cause a transfer of magnetic ink to the magnetic recording medium. In some prior art conductive windings through the teeth of the comb have had to pass through the gap two or three times to achieve the necessary ampere-turns necessary to provide adequate magnetic ink transfer, and this is difficult with the small spacing involved between comb teeth. For example, if a matrix approach (to be more particularly described below) is used, both a "word" drive and a "digit" drive line must be provided for each gap. If a 14 inch paper width is used, which is not uncommon, then at a resolution of 120 gaps per inch, there is required a total of 1680 gaps. In the past, each of these gaps have had to be threaded with from four to six word line and digit drive line conductors. Fabrication of such a printing head therefore required a great number of separate operations each requiring the placement of a single conductor within a slot which is typically only four mils wide. Even if such a process could be automated, the requisite equipment would be extremely expensive.

SUMMARY OF THE INVENTION

In accordance with one embodiment of the present invention, the digit conductor winding is not threaded through corresponding positions in adjacent words but rather is located in a position which is, in effect, the mirror image of its position in an adjacent word. This circuit arrangement permits a planar circuit to be constructed thereby rendering possible and practicable the fabrication of such circuitry on flexible printed circuit substrates. In this new configuration, to insure coincidence between word line and digit current directions, alternate digit lines are driven in opposing directions. These alternating directions for the digit line drive currents are simply provided, however, by altering connections to the drive circuitry. The word drive lines are threaded through adjacent gaps in the comb in a zig-zag fashion and are also mounted on a printed circuit substrate provided within an unsupported region through which the comb structure is disposed.

Accordingly, it is an object of this invention to provide an easily assembled transverse magnetic printing head in which there are no circuit crossovers and for which the drive circuitry is easily fabricated on flexible printed circuit substrates.

DETAILED DESCRIPTION OF THE INVENTION

Figure 1:
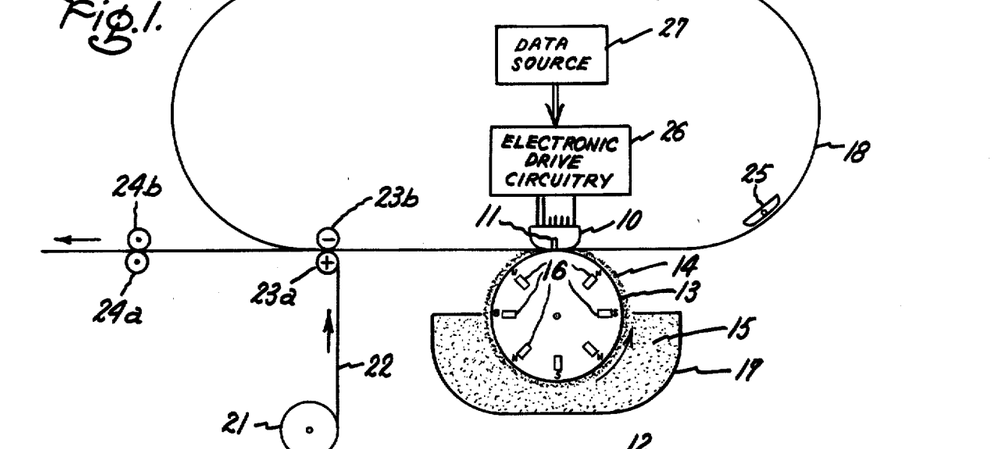
FIG. 1 is a schematic diagram illustrating the operation of a magnetic printing system.

FIG. 1 illustrates the basic structure in a magnetic printing system and is included herein for the purpose of more particularly describing and pointing out the area of application of the present invention, its operation and its interrelationship with other components in the magnetic printing system. The invention herein relates to a novel configuration for the drive line circuitry associated with the magnetic printing head 10 which contains a comblike structure 11 portions of which are selectively driven to produce a magnetic flux therein so as to magnetize portions of the magnetic recording medium, belt 18. During its motion, the magnetized portions of the magnetic recording medium 18 pick up a certain amount of magnetic ink 14 from the rotating magnetic brush cylinder 13 which encloses a plurality of fixedly mounted, alternately aligned permanent magnets 16 which cause the magnetic ink 15 in the magnetic ink reservoir 17 to adhere to the magnetic brush roller 13 as it rotates. Paper 22 from paper supply roller 21 is fed through electrically charged rollers 23a, 23b along with the magnetic recording medium 18 on which the pattern to be printed has been generated by the magnetic printing head 10. During the passage through electrically charged rollers 23a, 23b, the ink pattern is transferred to the paper which is further passed through heated rollers 24a, 24b where the ink is permanently affixed to the paper. The patterns which can be generated by this system can be alphanumeric data or even graphical data. The data to be printed is supplied by data source 27 which can be a digital computer or an off line magnetic tape or magnetic disk source. The only requirement being that it be in a digital form. The data signals supplied by the data source 27 are presented to electronic drive circuits 26 which convert the data source patterns into control signals supplied to the magnetic printing head 10. Prior to receiving the magnetic ink 14, the magnetic recording medium is erased by demagnetizing head 25.

Figure 2:
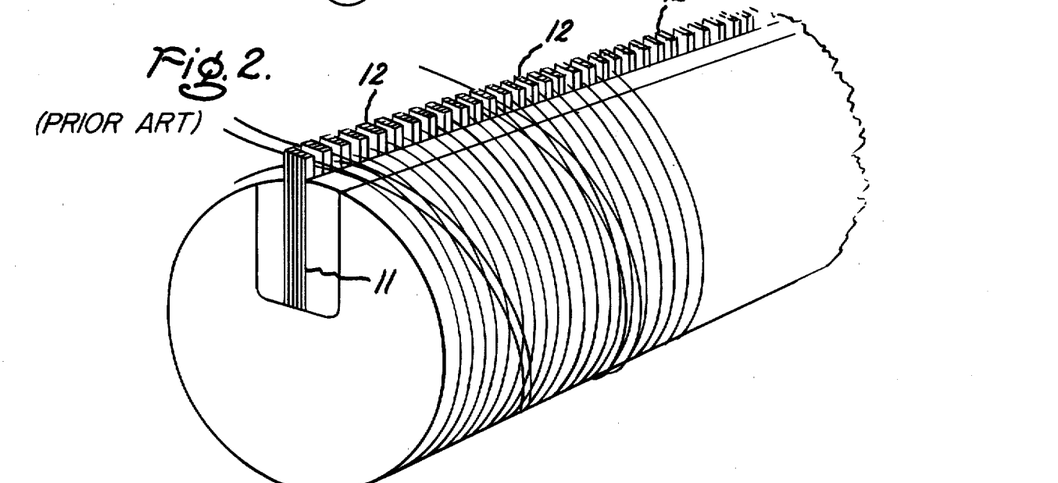
FIG. 2 is a drawing of a prior art winding method for the comb structure of a magnetic printing head.

FIG. 2 illustrates a known method of forming single conductor windings through the teeth 12 of the comb 11. Typically, in a fourteen inch wide printing line there are approximately 1,680 teeth and gaps through which at least one conducting drive line must be threaded. It is possible to drive, that is to activate each one of these gaps independently; however, such a system requires 1,680 separate drive circuits. Experiments indicate that it requires approximately 8 to 10 ampere-turns to sufficiently activate a particular gap. Since the width of the gap is relatively small (approximately 4 mils), to provide improved pattern resolution, the diameter of the wire used to thread the gaps may be too small to adequately carry a current of from 8 to 10 amperes thus necessitating, even in a system independently driving each gap, the use of at least two conductor windings through each gap. This means that at least approximately 3,400 separate winding operations must be performed in the fabrication of a single magnetic printing head. This is impractical and uneconomical in addition to being tedious and subject to error.

An alternative to the drive system in which each gap is driven independently is the coincident current drive system. In this system the gaps are grouped in adjacent segments referred to as "words." Each word contains an equal number of "digits," each digit being represented by a single gap. Each gap is threaded with a word drive line and a digit drive line. However, each of these conductors carries only half of the current necessary to achieve adequate magnetization in the recording medium 18. Thus to produce a magnetized region on the recording medium 18, the coincidence of a current pulse on the digit drive line and the word drive line through a gap is required. Of necessity, the current directions in these two separate drive line segments must be the same otherwise each will cancel the effect of the other, thereby failing to produce the desired magnetization.

For example, consider the situation in which there are 1,600 gaps. If each gap is driven independently, this requires 1,600 independent drive circuits. However, if a coincident current system is utilized only 40 word drive line circuits and 40 digit drive line circuits are required. In this coincident current drive system, any one of the 1,600 gaps may be selectively magnetized by selectively pulsing one of the 40 word drive lines and one of the 40 digit drive lines.

Figure 3:
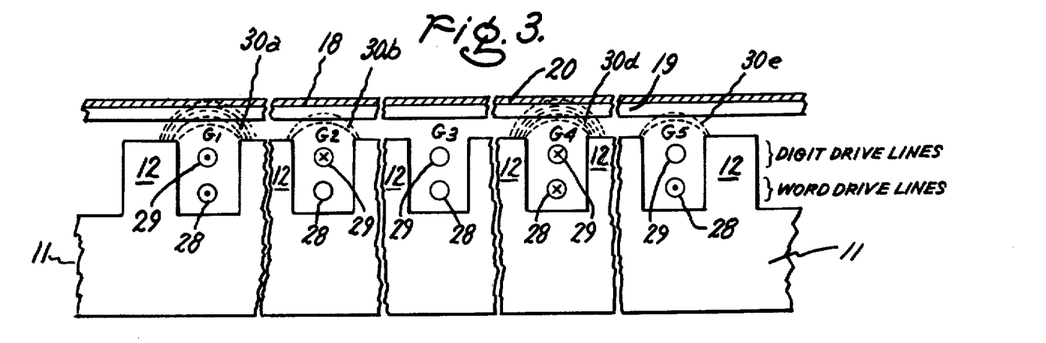
FIG. 3 is a side elevation view showing the relationship of the comb structure to the magnetic recording medium.

FIG. 3 illustrates the relationship between the magnetic recording medium, the comb structure and the digit and word drive lines as structured in the present invention. The magnetic recording medium 18 moves in a direction either into or out of the paper as shown in FIG. 3. The magnetic recording medium 18 is typically composed of a 0.7 to 0.8 mil backing material 19 such as Mylar ® to which is applied a coating of a ferromagnetic oxide 20. The comb 11 is typically composed of a laminated structure of approximately five layers of a material chosen for its high magnetic permeability, such as provided by certain nickel-iron alloys. The comb structure 11 has teeth 12 forming gaps which operate in the vicinity of the magnetic recording medium 18. Shown in FIG. 3 are typical gaps $G_1$ through $G_5$ in various states of activation. Also shown in FIG. 3 are the digit drive lines 29 and the word drive lines 28 threaded through each gap. We do not mean to suggest, however, that in FIG. 3 any or all of the word or digit drive lines represent the same line.

Consider now the effect of the currents in the digit and word drive lines on the magnetic flux density between adjacent teeth. For example, in gap $G_1$ there is indicated by the presence of the dot in the center of the conductors the presence of a current flowing in a direction out of the paper. The coincidence of these two currents is sufficient to produce a magnetic field 30a of sufficient strength to magnetize the corresponding portion of the magnetic recording medium 18. In gap $G_2$ there is indicated the presence of an electric current flowing in a direction that is into the paper (as indicated by the cross in the digit drive line conductor). Also in gap $G_2$, the lack of either symbol in the word drive line conductor indicates the lack of any current in that conductor. Thus, in gap $G_2$ the coincidence of currents is lacking and the magnetic field 30b bridging gap $G_2$ is of insufficient strength to cause magnetization of a corresponding region on the magnetic recording medium 18. In gap $G_3$, neither digit nor word drive lines have a current present and the resulting magnetic field is therefore not present and no magnetization on the recording medium 18 occurs. In gap $G_4$, there is indicated the presence of a current flowing in the digit and word drive line conductors in a direction out of the paper. Since there is a coincidence of current, the magnetic field 30d bridging the gap is sufficient to cause magnetization of a corresponding region on magnetic recording medium 18. In gap $G_5$, there is no current present on the digit drive line and, therefore, any current on the word drive line, in whatever direction, is insufficient to cause magnetization of a region on the magnetic recording medium 18. In the typical operation of a magnetic printing system a plurality of either word drive lines or digit drive lines are activated simultaneously.

Figure 4:
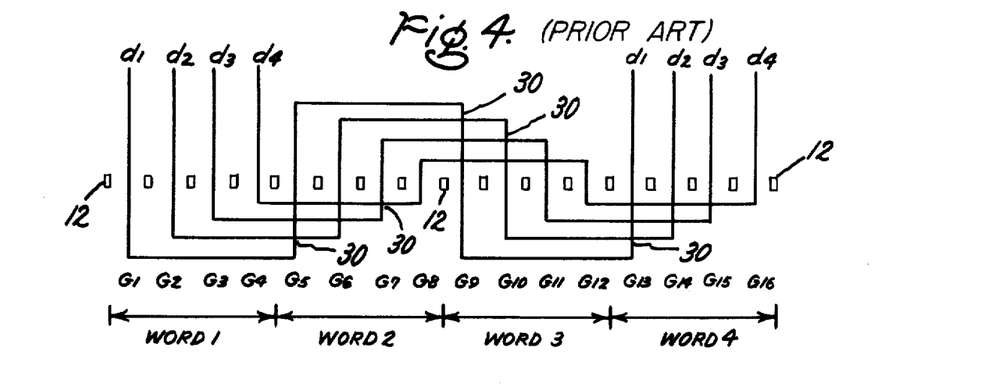
FIG. 4 illustrates the relationship between the digit windings and the teeth of the comb structure in some prior art winding methods.

FIG. 4 illustrates a problem encountered by prior art winding techniques for the digit drive lines. For ease of understanding, FIGS. 4, 5, and 6 each deal with a magnetic recording head structure which is divided into four words with each word also having four digits. More conventional structures would typically have 40 words with 40 digits per word or perhaps 12 words with 20 digits per word. As shown in FIG. 4, the conventional prior art structure was arranged so that the first digit drive line of word 1 is also the drive line for the first gap position in word 2, and the first gap position in word 4, etc. The drive line for the second digit is similarly configured to pass through corresponding positions in adjacent words. This results in a multitude of crossovers 30 which do not pose problems for the insulated wire shown in FIG. 2. However, FIG. 2 is a tedious and uneconomical and error prone structure for magnetic printing heads. It is desirable to mass produce these windings for the comb structure of the transverse magnetic printing head, such as by printed circuit methods. However, the presence of a multiplicity of crossover points 30 as shown in FIG. 4 precludes the use of the winding scheme shown in FIG. 4 for easy use in printed circuit methods. A printed circuit board utilizing the concept illustrated in FIG. 4 requires at least two layers and requires extensive hole drilling which introduces other errors such as hole plate-through and short circuits through pin holes, etc.

Figure 5:
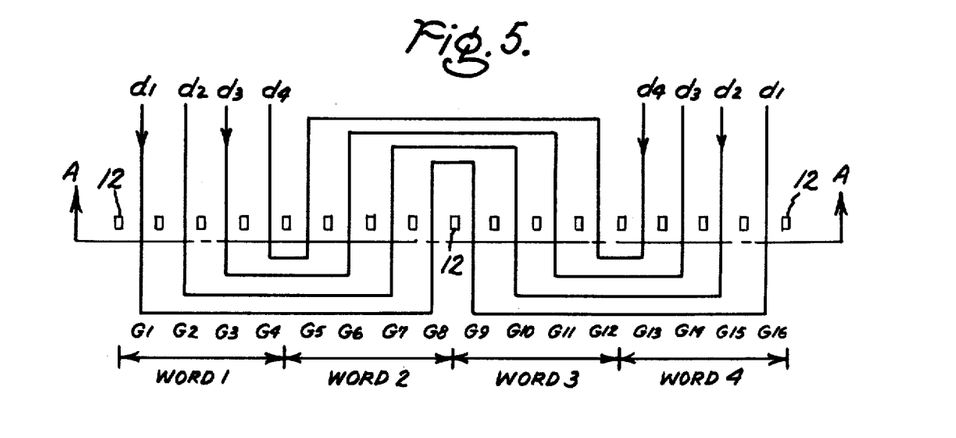
FIG. 5 illustrates the relationship between the digit windings and the teeth of the comb structure in accordance with the present invention.

An important feature of the present invention is illustrated in FIG. 5. Here, for example, digit line $d_1$ is wound (threaded) through the first gap in word 1 and the last gap in word 2, the first gap in word 3 and the last gap in word 4. Similarly, the second digit line, $d_2$, is wound through the second gap in word 1 and the next to last gap in word 2, the second gap in word 3 and the next to last gap in word 4. The third digit line, $d_3$, is wound through the third gap in word 1 and the third gap from the end in word 2, the third gap in word 3 and the third gap from the end in word 4. The fourth digit line is wound in a similar manner, as shown. In effect, the digit lines in alternate adjacent words are threaded through the gaps in a mirror image fashion. The advantage of this method is that it completely avoids crossovers and permits the fabrication of planar flexible printed circuits for the digit drive lines of a transverse magnetic printing head.

In general, if the gaps are organized in a matrix structure with W words and D digits per word, then the digit line is threaded through the $i^{th}$ gap in half of the words in an alternating fashion, and through the $(D-i+1)^{th}$ gap in the remaining words also in an alternating fashion. To be more specific, a digit line tranversing the $j^{th}$ gap in alternate words, traverses the $(D-j+1)^{th}$ gap in the remaining alternate words. The gaps within any word are labeled consistently from left to right or from right to left. For example, in a left to right labeling, gap $G_{11}$ in FIG. 5 is described as the third gap in word 3.

It is noted here that to produce the desired magnetization on the recording medium 18, the digit windings are driven in an alternate fashion as shown in FIG. 5 to insure coincidence. That is, the selected current directions in alternating digit lines are reversed. In FIG. 5, for example, digit lines $D_1$ and $D_3$ are driven in the same direction and digit lines $D_2$ and $D_4$ are driven by currents in the opposite direction. This merely requires alternating the connections that the digit lines make with the electronic drive circuitry 26. It is further noted that the small rectangular box as 12 in FIG. 5 represent the teeth of the comb structure which form the gaps through which the digit windings pass.

Figure 6:
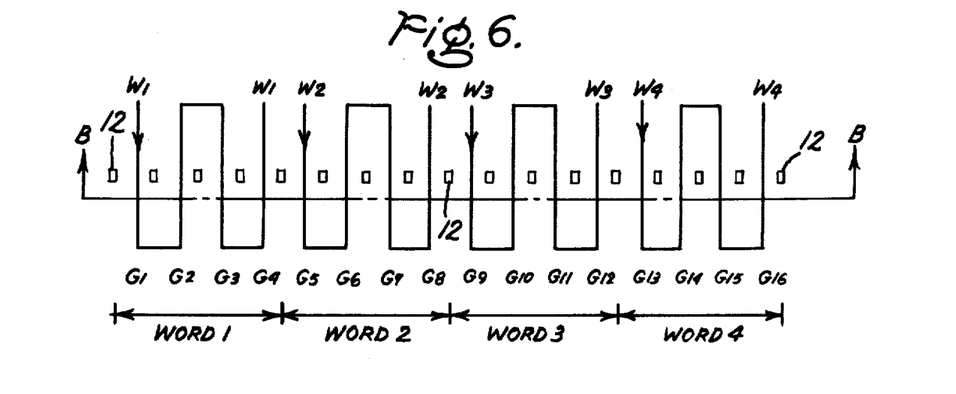
FIG. 6 illustrates the relationship between the word windings and the teeth of the comb structure in accordance with the present invention.

FIG. 6 illustrates the corresponding word lines for the digit drive lines in FIG. 5. Again, solely for ease of explanation, a four word structure with four digits per word is shown. The structure of the word drive lines is relatively simple in comparison to the digit drive line configuration of FIG. 5 or, for that matter of FIG. 4. The word drive lines form a zig-zag pattern threading through adjacent gaps each segment of four adjacent gaps forming a word. The word drive lines are all pulsed with currents flowing in the same direction in the winding but in alternating directions in the gaps as is shown in FIG. 6. The planar nature of the word line circuits remits their fabrication on a printed circuit medium without further modification. It is, however, the digit drive line structure that permits both the word and digit drive lines to be fabricated upon two printed circuit boards or even on both sides of a single printed circuit board.

Table I below illustrates the operation of the circuit shown in FIGS. 5 and 6. For purposes of illustrating direction of current flow, section A—A is shown in FIG. 5

TABLE I

| Gap Position | Control Lines | | Currents (Sections A—A and B—B) | |
|---|---|---|---|---|
| | Digit | Word | Digit Lines | Word Line |
| 1 | $D_1$ | $W_1$ | ⊙ | ⊙ |
| 2 | $D_2$ | $W_1$ | ⊗ | ⊗ |
| 3 | $D_3$ | $W_1$ | ⊙ | ⊙ |
| 4 | $D_4$ | $W_1$ | ⊗ | ⊗ |
| 5 | $D_4$ | $W_2$ | ⊙ | ⊙ |
| 6 | $D_3$ | $W_2$ | ⊗ | ⊗ |
| 7 | $D_2$ | $W_2$ | ⊙ | ⊙ |
| 8 | $D_1$ | $W_2$ | ⊗ | ⊗ |
| 9 | $D_1$ | $W_3$ | ⊙ | ⊙ |
| 10 | $D_2$ | $W_3$ | ⊗ | ⊗ |
| 11 | $D_3$ | $W_3$ | ⊙ | ⊙ |
| 12 | $D_4$ | $W_3$ | ⊗ | ⊗ |
| 13 | $D_4$ | $W_4$ | ⊙ | ⊙ |
| 14 | $D_3$ | $W_4$ | ⊗ | ⊗ |
| 15 | $D_2$ | $W_4$ | ⊙ | ⊙ |
| 16 | $D_1$ | $W_4$ | ⊗ | ⊗ | through the digit drive lines and in FIG. 6 section B—B is shown through word drive lines. The current directions shown in the last two columns of Table I indicate the direction of current flow as seen looking in through these corresponding sections. The digit and word drive line current directions are as shown in FIGS. 5 and 6. For example, to produce an ink dot on the magnetic recording medium 18 corresponding to the position of a gap $G_7$, which is the third and next to the last gap in word 2, a current pulse is provided on digit line $D_2$ and on word drive line $W_2$. Looking in through Section A—A and B—B, the result is a coincidence of current in gap $G_7$ in a direction towards the observer. Since these are the only two drive lines being pulsed, no other gap experiences this coincidence of current and no other gap is magnetically energized. In a similar fashion as shown in Table I, any one of the other 16 gaps is selectively energized. It is noted here that the normal mode of operation for a magnetic printing system is to energize one digit line at a time and to selectively address word lines eventually producing a total scan of a single line, with a plurality of such scanned lines being used to generate such things as a line of alphanumeric printed data.

Figure 7:
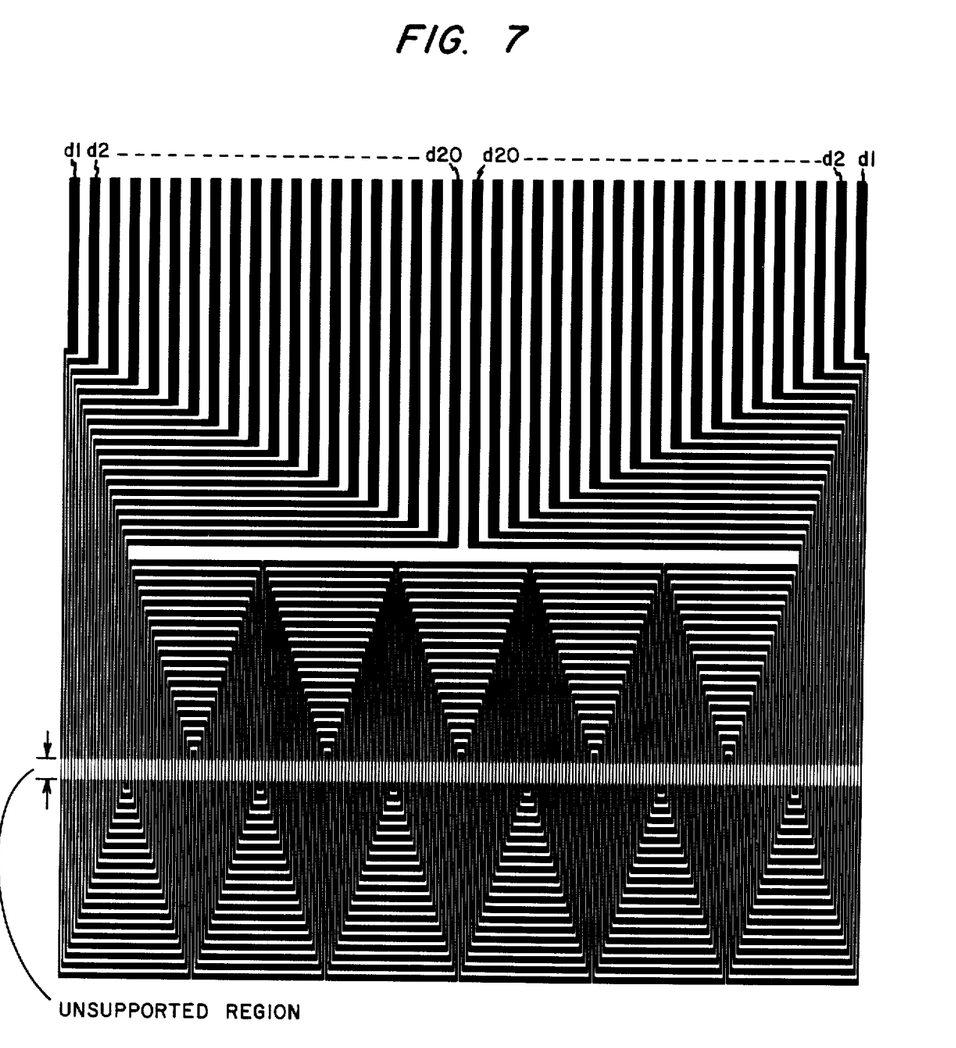
FIG. 7 is an enlarged photograph of a printed circuit wiring pattern for the digit line drivers for the case in which there are 20 digits per word.
Figure 8:
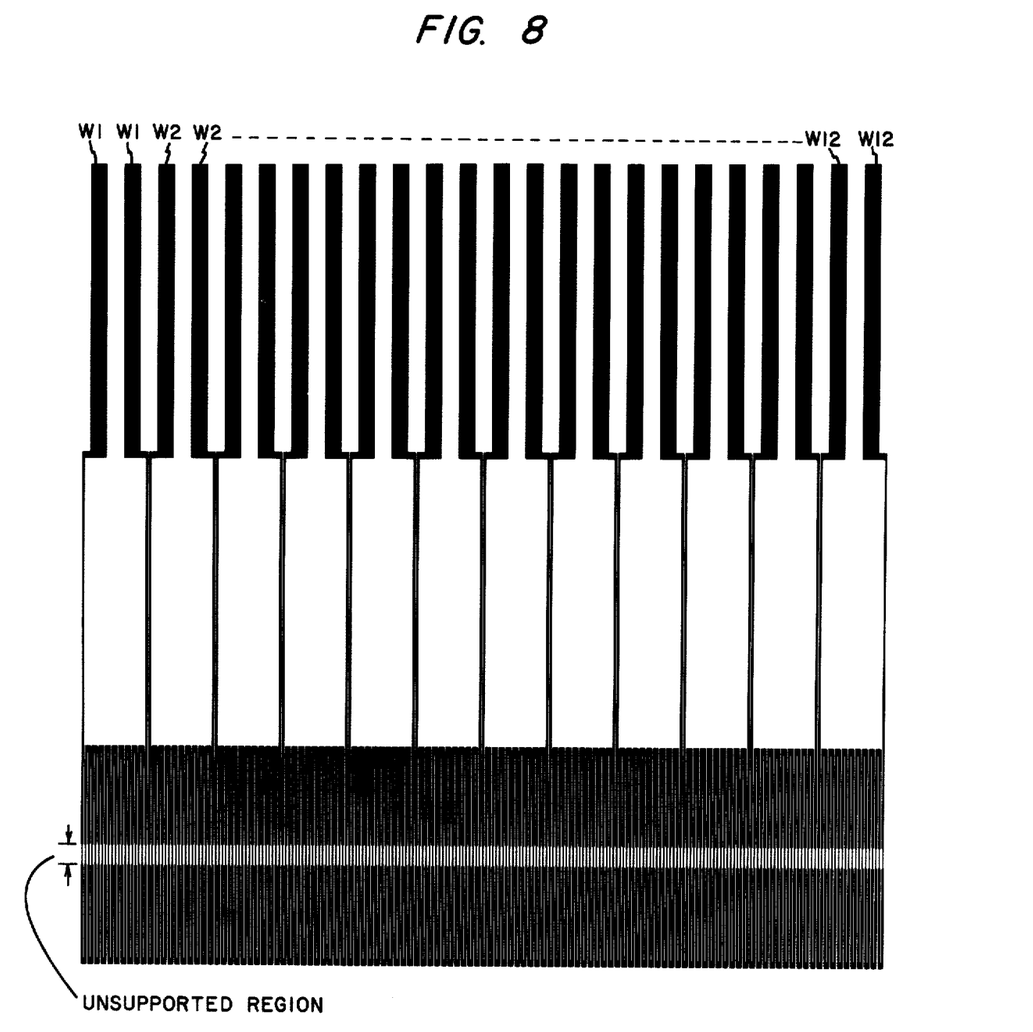
FIG. 8 is an enlarged photograph of the layout pattern for a printed circuit board illustrating the placement of the word line drive circuits for the situation in which there are 12 words and 20 digit lines per word.

FIG. 7 illustrates a printed circuit digit drive line pattern for a more practical situation than that illustrated in FIGS. 5 and 6, in which, in this case there are twelve words with 20 digits per word for a total count of 240 gaps or approximately a 2 inch wide printed line. The corresponding line drive patterns are illustrated in FIG. 8. While a 2 inch wide line may be practical for certain applications, the primary utility for such a small segment is in a modularly structured magnetic printing head containing, for example, seven of these modular units for a total and more typical line width of 14 inches.

As illustrated in FIGS. 7 and 8, there is a required gap in the printed circuit board through which the comb structure protrudes. This requirement of an unsupported gap region in the printed circuit board (but not in the conductive wiring) necessitates a modified printed circuit fabrication process.

Apart from the presence of the gap in the supporting printed circuit substrate, the fabrication of the printed circuit wiring is accomplished by standard photoetching processes. A thin top conductive sheet typically approximately 2 mils thick is bonded to a flexible insulated supporting substrate such as Mylar ® photoresist or anodized aluminum. If a single printed circuit board with the word drive lines and the digit drive lines on opposite sides is desired, then a second copper sheet is bonded to the opposite side of the substrate. Then a thin layer of photoresist is applied to each side of the copper sheet or sheets which are then exposed and developed. The copper sheets are then etched through to form the digit and/or word line circuit patterns. The printed circuit board is then thoroughly cleaned to remove any chemical residue and the circuit is electrically insulated particularly around the unsupported area. The insulation is accomplished by dipping or spraying insulating material such as nylon or epoxy or by employing a special polymer process to be more particularly described below.

There are two basic methods for producing a printed circuit board with the required gap. First, the gap may be present initially in the insulating substrate in which case the copper or other conductive sheet provides the integrating structure during the assembly. In this method, the usual photoresist and etching processes are employed, dissolving copper except in those areas where the wiring is desired and forming a bridge of fine wires across the gap in the substrate. Second, the gap may also be formed by photoresist techniques in which case the substrate is either an insulated metal or a photosensitive polymer material either of which is selectively dissolvable upon immersion or application of appropriate etchants. In this second method of gap fabrication, it is preferred that an insulated metal substrate be used since it provides a greater degree of dimensional stability than is provided by photosensitive polymers.

Because of the small dimensional tolerances required in the completed magnetic printing head assembly, care and certain precautions are to be followed in the final assembly procedure. In particular, care must be taken to see that the comb, the word drive lines and the digit drive lines are all insulated each from the other. A good and strong insulation is required as a result of the small fine edges present on the comb which might otherwise scrape the insulation from the conductive windings during assembly. As indicated above, the insulation may be applied either by spraying or dipping processes. One possible insulating material that is usable, if desired, is Teflon. Another insulating material which provides the kind of protection needed in this application is the monomer Parylene ® (as supplied by Union Carbide, Inc.). Using this insulating material requires the vaporization of the Parylene ® monomer. The printed circuit assembly is exposed to this vaporized monomer and the material polymerizes on contact with the conducting wires. Parylene ® is thus a preferred insulating material in this application not only because it forms an even conformal coating around each conductor but also because it has lubricant qualities which facilitate assembly of the completed flexible printed circuits to the structure holding the comb.

Figure 9:
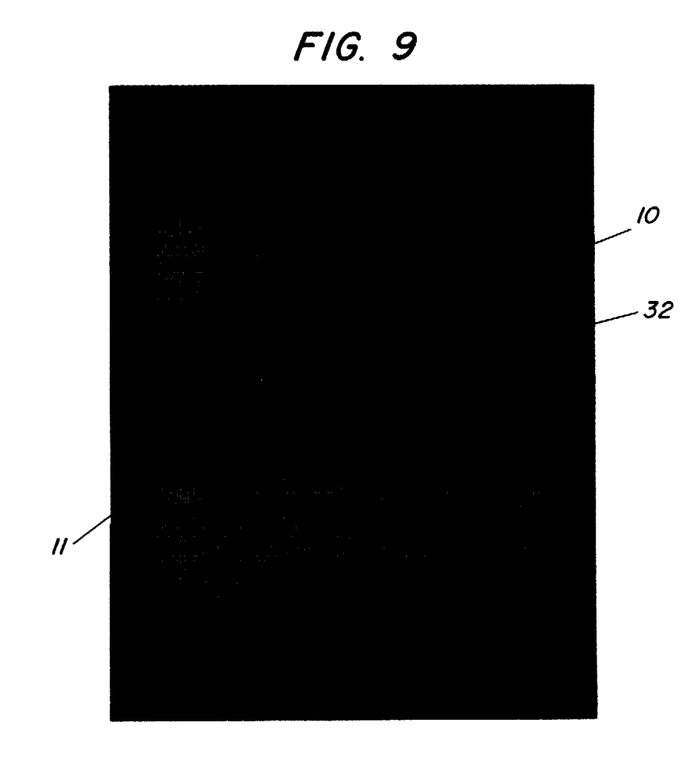
FIG. 9 is an enlarged photograph illustrating the relationship between the comb structure and the printed circuit word line drives.

FIG. 9 illustrates the partially assembled magnetic printing head assembly 10 after the flexible word drive line printed circuit has been fixed in position with the teeth of the comb protruding through the gap in the printed circuit board and through the zig-zag pattern of word drive lines.

Figure 10:
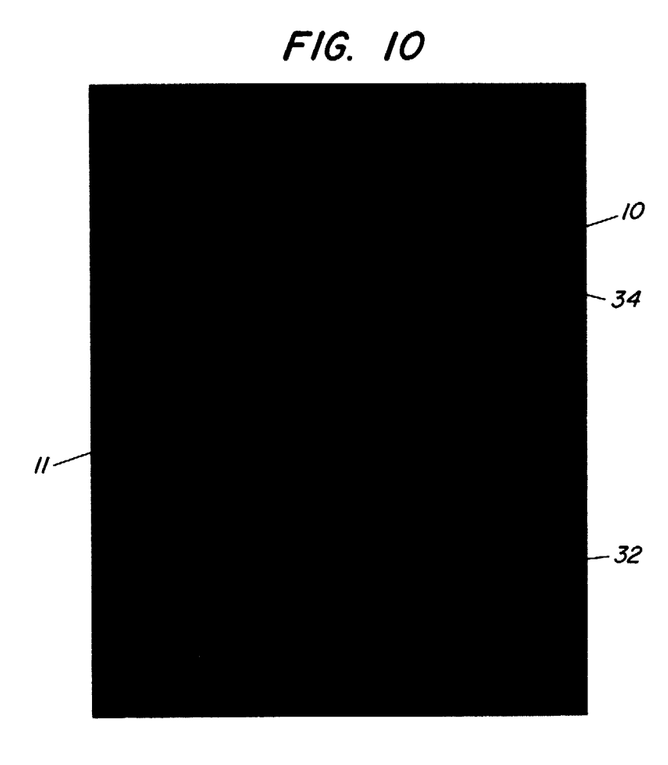
FIG. 10 is an enlarged photograph illustrating the relationship between the comb structure, the word line drive circuitry and the digit line drive circuitry in a completed magnetic printing head assembly.
Figure 11:
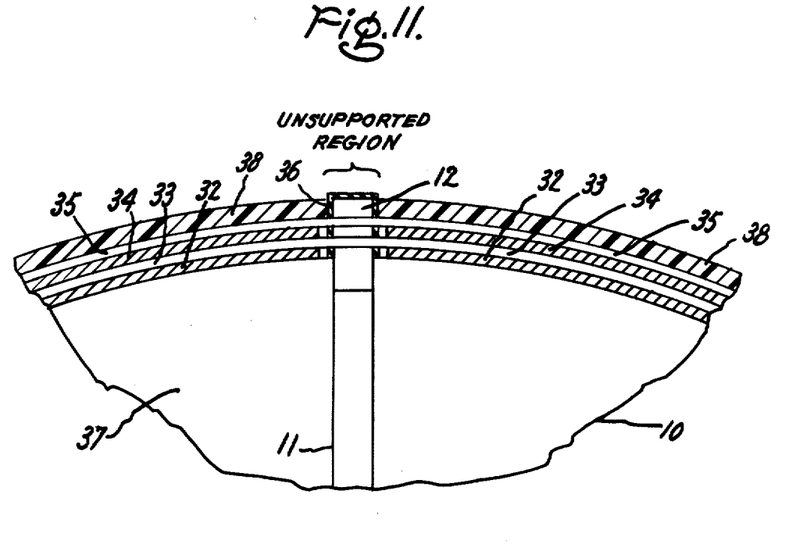
FIG. 11 is a side elevation sectional view of a completely assembled magnetic printing head assembly detailing the structure in the region of the comb in accordance with the present invention.

FIG. 10 shows a completed magnetic printing head assembly with the separate digit drive line flexible printed circuit affixed with the teeth of the comb also protruding through the gap in the digit drive line flexible printed circuit board and through the digit drive line windings. A more detailed drawing of the finally assembled magnetic printing head structure in the region of the comb is provided in FIG. 11. Here comb 11 with tooth 12 protected with insulation 36 protrudes from supporting member 37 which is typically composed of anodized aluminum. As shown in FIG. 11, the printed circuit board 32 for the word line drivers is first fixed to supporting member 37. This flexible printed circuit board also holds the word drive lines as typified by the line shown at 33. Over the word drive printed circuit board is layed and affixed the digit drive printed circuit board 34 with its digit lines 35. It is not critical, however, that the word line drives be applied to supporting member 37 first but if desired the digit drive printed circuit board may be applied first. Over the completed assembly there is placed a layer of epoxy or other plastic 38 over which the magnetic recording medium may smoothly pass.

The completed magnetic printing head assemblies may, if desired, be manufactured as a single unit. However, if dimensional tolerances are critical the magnetic printing head may, if desired, be assembled in modular units, for example, units approximately two inches in length. The modular construction requires a greater complexity in assembling the interconnection but has less stringent tolerance requirements.

From the above, it can be appreciated that the invention herein provides a novel method of providing windings for the recording head of a transverse magnetic printing system. The primary advantage resulting from this drive line winding method is that now the drive circuitry can be fabricated on printed circuits and easily assembled with the comb and supporting structures thereby providing a reliable, high-resolution, mass-producible magnetic printing head.

While this invention has been described with reference to particular embodiments and examples, other modifications and variations will occur to those skilled in the art in view of the above teachings. Accordingly, it should be understood that within the scope of the appended claims, the invention may be practiced otherwise than is specifically described.

The invention claimed is:

1. A transverse magnetic printing head driven in a coincident current mode in which there are (W×D) recording gaps organized into W adjacent word segments, each word segment having D independent digits, said head comprising:

a rigid supporting member having a transverse slot therein;

a comb structure of high magnetic permeability material with teeth forming (W×D) recording gaps between the tips of said teeth, said comb structure being received into the transverse slot of said supporting member in such a manner that the teeth of said comb structure protrude above said supporting member;

an insulated word line drive circuit with W independent word lines, each of said word lines forming a zig-zag pattern spaced so as to match the spacing of the teeth on the comb structure, each of said word lines repeatedly crossing said transverse slot and threading through a selected one of said recording gaps, said word line drive circuit being mounted in a flush manner against said supporting member so as to align the magnetic comb structure with said transverse slot; and an insulated digit line drive circuit with D independent digit lines, each digit line, $d_i$, for i ranging from 1 to D, being spaced and laid out in such a manner so as to thread through the $i^{th}$ recording gap position in alternate word segments and through the $(D-i+1)^{th}$ recording gap position in the remaining word segments, each such digit line also repeatedly crossing said transverse slot, said digit line drive circuit being mounted in a flush manner either over or under said word line drive circuit so as to align the magnetic comb structure with the transverse unsupported gap region.

2. The transverse magnetic printing head of claim 1 in which the rigid supporting member is anodized aluminum.

3. The transverse magnetic printing head of claim 1 in which the comb structure is composed of nickel-iron alloy.

4. The transverse magnetic printing head of claim 1 in which said word and digit line drive circuits are each fabricated on a printed circuit board.

5. The transverse magnetic printing head of claim 4 in which the digit line and word line circuits are each fabricated on opposite sides of the same printed circuit board.

6. The transverse magnetic printing head of claim 4 or 5 in which the printed circuit board is composed of a flexible material selected from the group consisting of epoxy, insulated metal, and photosensitive polymers.

7. The transverse magnetic printing head of claim 6 in which said rigid supporting member comprises a smoothly arched surface and wherein each of said printed circuit boards is mounted in a flush manner against said smoothly arched surface.

* * * * *